United States Patent
Kanakasabapathy et al.

(10) Patent No.: US 8,377,795 B2
(45) Date of Patent: Feb. 19, 2013

(54) CUT FIRST METHODOLOGY FOR DOUBLE EXPOSURE DOUBLE ETCH INTEGRATION

(75) Inventors: Sivananda K. Kanakasabapathy, Albany, NY (US); Veeraraghavan S. Basker, Albany, NY (US); Balasubramanian S. Haran, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 269 days.

(21) Appl. No.: 12/698,448

(22) Filed: Feb. 2, 2010

(65) Prior Publication Data

US 2010/0203717 A1    Aug. 12, 2010

Related U.S. Application Data

(60) Provisional application No. 61/151,893, filed on Feb. 12, 2009.

(51) Int. Cl.
*H01L 21/762* (2006.01)
*G03C 5/00* (2006.01)

(52) U.S. Cl. .......... 438/424; 438/585; 430/394

(58) Field of Classification Search .......... 438/734, 438/749, 750, 751
See application file for complete search history.

(56) References Cited

U.S. PATENT DOCUMENTS

| | | | |
|---|---|---|---|
| 5,326,727 A * | 7/1994 | Kook et al. | 438/699 |
| 8,071,278 B1 * | 12/2011 | Yamamoto | 430/394 |
| 2006/0216649 A1 * | 9/2006 | Paxton et al. | 430/311 |
| 2006/0258098 A1 * | 11/2006 | Lee | 438/258 |
| 2007/0018286 A1 * | 1/2007 | Chen | 257/640 |
| 2007/0212648 A1 | 9/2007 | Lalbahadoersing et al. | |
| 2007/0212863 A1 | 9/2007 | Brunner et al. | |
| 2008/0032508 A1 | 2/2008 | Chang | |
| 2009/0294800 A1 * | 12/2009 | Cheng et al. | 257/192 |
| 2009/0325360 A1 * | 12/2009 | Lim | 438/424 |
| 2010/0009131 A1 * | 1/2010 | Basker et al. | 428/195.1 |

FOREIGN PATENT DOCUMENTS

JP    2001-015426    *    1/2001

* cited by examiner

*Primary Examiner* — Zandra Smith
*Assistant Examiner* — Pamela E Perkins
(74) *Attorney, Agent, or Firm* — Wenjie Li; Ira Blecker

(57) ABSTRACT

A multiple etch process for forming a gate in a semiconductor structure in which a cut area is first formed followed by the forming of the gate conductor lines.

13 Claims, 5 Drawing Sheets

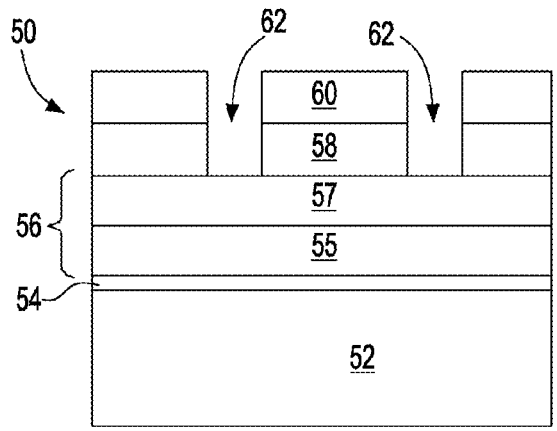
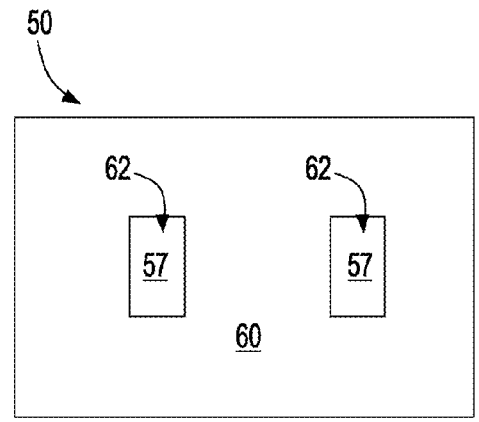
FIG. 6A  FIG. 6B
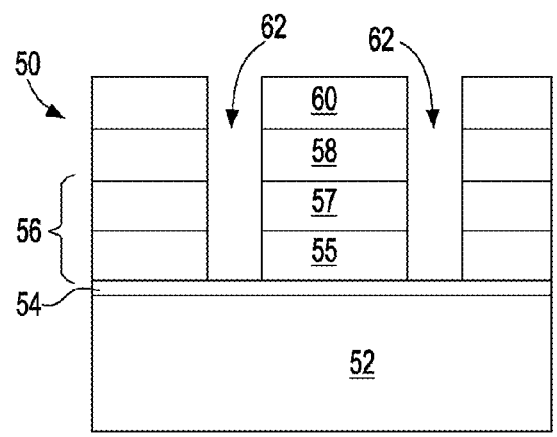
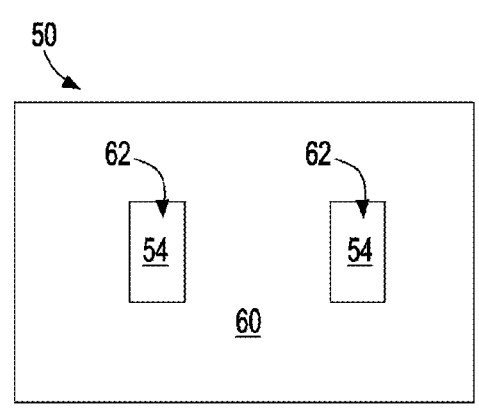
FIG. 7A  FIG. 7B
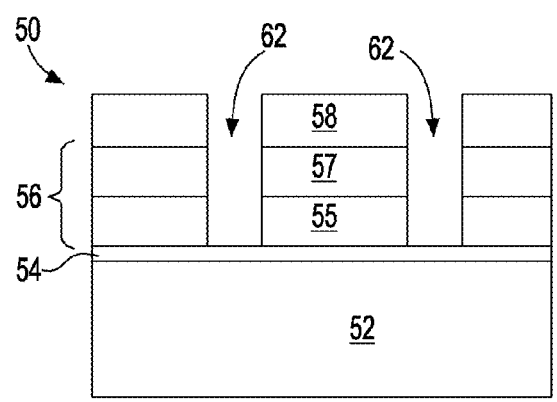
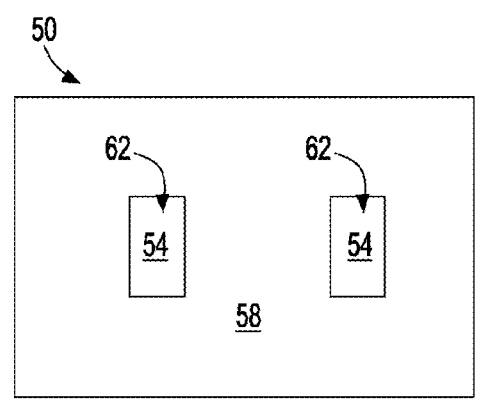
FIG. 8A  FIG. 8B

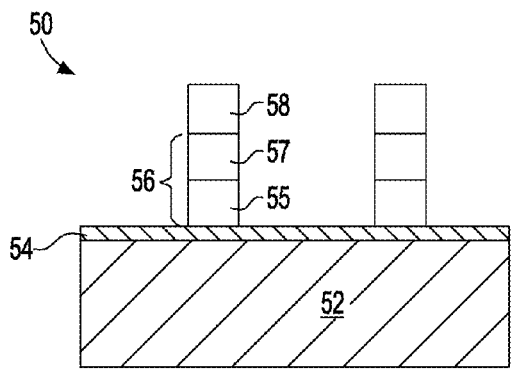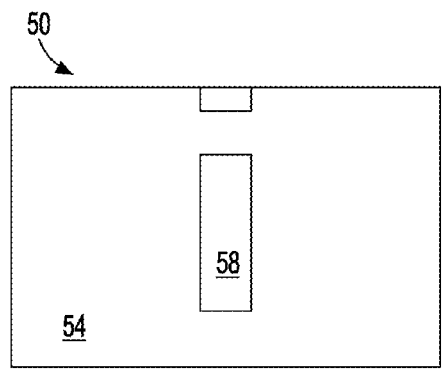
FIG. 12A　　　　FIG. 12B
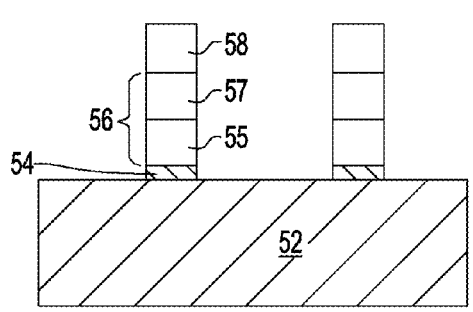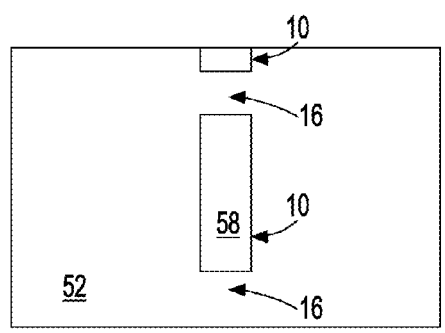
FIG. 13A　　　　FIG. 13B

CUT FIRST METHODOLOGY FOR DOUBLE EXPOSURE DOUBLE ETCH INTEGRATION

This non-provisional application claims the benefit of the provisional application filed with the U.S. Patent and Trademark Office as Ser. No. 61/151,893 entitled "Cut First Methodology For Double Exposure Double Etch Integration", filed Feb. 12, 2009.

BACKGROUND OF THE INVENTION

The present invention relates to the field of forming CMOS integrated circuits, in particular the gate electrode of a CMOS transistor. More particularly, the present invention relates to a double exposure double etch method for forming the gate electrode.

There is a strong drive for designers to shrink dimensions of CMOS integrated circuits. The advantages of smaller dimensions include more logic gates per area for more functionality, faster device speed, hence faster overall circuit speed and lower manufacturing cost per function. These advantages will continue to drive a need to shrink dimensions. At the present time, virtually all semiconductor manufacturing use optical lithographic methods, with exposure wavelengths as short as 193 nm.

As dimensions in integrated circuits have shrunk down to the limits of resolution of current lithographic technology, many attempts have been made to circumvent the resolution limitations of optical lithography.

In current technology, a CMOS integrated circuit is built up from a number of pattern layers, most of which are not relevant to the current invention. One of the most critical pattern layers that is important to the present invention defines the transistor gates, hereinafter referred to as just gates. It is well known that control of the transistor gate area is crucial to the attainment of high speed circuitry. In particular, linewidth deviations of the gates will cause transistor speed deviations which will disrupt the desired overall circuit timing and performance.

In semiconductor processing today, the gates are built by an advanced process called double exposure double etch which is illustrated in FIGS. 1 through 4. FIG. 1 illustrates the layout design of the gates 10. The linewidth of the gates 10 is a critical dimension which must be accurately controlled. The gates 10 are separated by gap 12. The dimension of gap 12 is a noncritical dimension. To achieve the layout design shown in FIG. 1, two separate lithographic processes are required. As shown in FIGS. 2A and 2B, there is first a gate lithographic process in FIG. 2A which defines the gate lines 14 and then a second so-called cut lithographic process in FIG. 2B which cuts the gate lines 14 at gate cut areas 16. By a Boolean addition of the gate lithographic process shown in FIG. 2A and the cut lithographic process shown in FIG. 2B, the overall lithographic process is illustrated in FIG. 3. It can be seen that where the gate cut areas 16 intersect with gate lines 14, gates 10 are formed. The final structure is shown in FIG. 4.

Referring back to FIG. 3, there are areas 18 which may be called overlap areas. What is meant by overlap areas is that the gate layer is first etched between the gate lines 14 and then the gate layer is etched again across the gate lines 14 to form gate cut areas 16. The overlap areas 18 are actually etched twice—once when the gate lines 14 are formed and then again when the gate cut areas 16 are formed. This double etching can lead to so-called punch through areas into the underlying silicon or shallow trench isolation (STI) areas by the following process. The overlapped area 18 is etched more into the gate layer (usually doped polysilicon) than either of the cut areas 16 or the areas between the gates 14. With each subsequent etching step into the metal gate layer and then any underlying layer such as a high dielectric constant dielectric layer ("high K layer"), the overlapped area 18 will always etch deeper. Ideally, the process should stop on the last layer which is the silicon layer or STI layer. But, since the overlap area 18 always etches ahead of the cut areas 16 and the areas between the gates 14, the overlap area may actually etch into the silicon layer or STI layer which is called punch through. Punch through is to be avoided.

The present inventors have recognized that the punch through problem is exacerbated by the difference in topography between the gate stack area and the STI area. This is illustrated in FIG. 5A for current state of the art semiconductors and FIG. 5B for advanced semiconductors. For purposes of the illustration in FIG. 5A, gate layer 20 is located at a different level than STI area 22. The bulk silicon is reference number 38. The difference in height 24 is called the RX topography. It should be understood that it is also possible that the STI area 22 could be at a higher level than the gate layer 20. Also shown in FIG. 5A is a hard mask 26 in conjunction with an organic planarizing layer 32 (called an "OPL" in the art) which are used to make the cut areas 16 (shown in FIGS. 3 and 4). According to current process guidelines, the OPL is etched in the cut areas 16 as indicated by 28 but some OPL is left, as indicated by 30, in the up area (i.e., the gate layer 20) so that the gate layer 20 is not actually etched in this process step. However, when progressing to FIG. 5B for advanced semiconductors, it can be seen that the hardmask 26 is thinner because of the requirement for thinner gate lines and to avoid overshadowing. Consequently, the OPL etching, as indicated by 34, etches into the gate layer 20 in the up area by an amount indicated by 36. Such etching into the up area (i.e., the gate layer 20 as shown in FIG. 5B) eventually leads to punch through in the overlap area 18.

The double exposure double etch process has been proposed by others as described above. Another example of a double exposure double etch process is disclosed in Brunner et al. U.S. Patent Application Publication US 2007/0212863, the disclosure of which is incorporated by reference herein.

There has also been proposed a double exposure single etch process in order to work around the present day limitations of optical lithography. Some examples of double exposure, single etch are disclosed in Chang U.S. Patent Application Publication US 2008/0032508 and Lalbahadoersing et al. U.S. Patent Application Publication US 2007/0212648, the disclosures of which are incorporated by reference herein. However, these references do not disclose the Boolean addition of gate and cut lithographic processes to arrive at a critically dimensioned gate.

BRIEF SUMMARY OF THE INVENTION

The various advantages and purposes of the invention as described above and hereafter are achieved by providing according to a first aspect of the invention a multiple etch process for forming a gate in a semiconductor device, the method comprising the steps of:

providing a semiconductor substrate;
forming a conductor layer for forming transistor gates on the semiconductor substrate;
applying a hard mask over the conductor layer;
applying a first planarization player over the hard mask;
patterning the hard mask and first planarization layer to form openings over the conductor layer;
etching the conductor layer through the openings to extend the openings into the conductor layer;
stripping the first planarization layer, leaving the openings in the conductor layer;
applying a second planarization layer over the conductor layer and in the openings in the conductor layer;
patterning the second planarization layer to form openings over the conductor layer for spaces between gate lines;

etching the conductor layer through the openings in the second planarization layer to form the spaces between gate lines resulting in lines of second planarization layer over lines of hard mask and conductor layer wherein the lines of hard mask and conductor layer being separated by the second planarization layer; and stripping the second planarization layer to result in gate lines comprising hard mask and conductor layer separated by cut areas.

According to a second aspect of the invention, there is provided a multiple etch process for forming a gate in a semiconductor device, the method comprising the steps of:

providing a semiconductor substrate;

forming a conductor layer for forming transistor gates on the semiconductor substrate;

applying a first planarization player over the conductor layer;

patterning the first planarization layer to form openings over the conductor layer;

etching the conductor layer through the openings to extend the openings into the conductor layer;

stripping the first planarization layer, leaving the openings in the conductor layer;

applying a second planarization layer over the conductor layer and in the openings in the conductor layer;

patterning the second planarization layer to form openings over the conductor layer for spaces between gate lines;

etching the conductor layer through the openings in the second planarization layer to form the spaces between gate lines resulting in lines of second planarization layer over lines of conductor layer wherein the lines of conductor layer being separated by the second planarization layer; and stripping the second planarization layer to result in gate lines comprising conductor layer separated by cut areas.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

FIGS. 6A to 13A illustrate side views and FIGS. 6B to 13B illustrate top views of a structure undergoing processing according to the present invention.

DETAILED DESCRIPTION OF THE INVENTION

Figure 1:
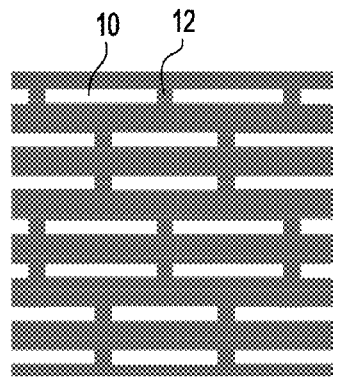
FIGS. 1 to 4 illustrate the conventional method of forming gates through a gate lithographic step followed by a cut lithographic step.
Figure 2A:
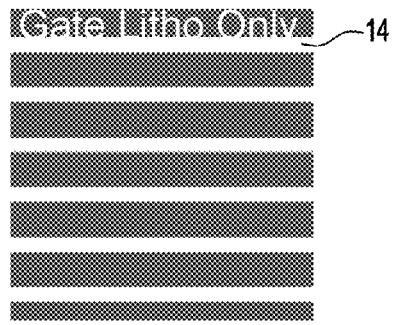
Figure 2B:
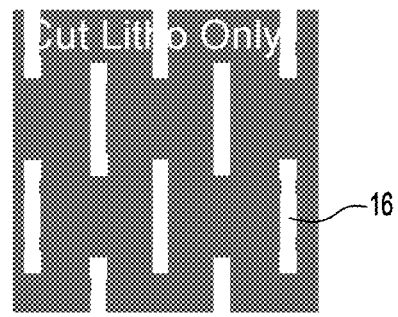

The present inventors have proposed a process in which the cut areas are etched first followed by etching for the gate lines. In so doing, the overlapped areas previously described are eliminated, thereby eliminating the problem of punch through.

In the following descriptions, FIGS. 6A through 13A show side views of the semiconductor structure as it is being formed while FIGS. 6B through 13B show corresponding top views of the semiconductor structure.

Referring first to FIGS. 6A and 6B, a portion of semiconductor structure 50 is shown having a first layer 52 which, due to the RX topography which is not shown in the following Figures, could be either the semiconductor material (silicon (Si), silicon germanium (SiGe), etc.) or the STI layer. Following is a high K layer 54 and gate layer 56. The gate layer 56 will usually include a conductor 57 such as doped polysilicon and may also include a metal gate material 55 such as titanium nitride (TiN), tungsten (W), tantalum nitride (TaN), tantalum carbide (TaC) and in general alloys of refractory metals and their nitrides. For purposes of defining the cut areas, there will also be a hard mask 58, for example a nitride, and an OPL 60. The OPL 60 should be very selective to the etching of the gate layer 56 and may be a material such as ODL (available from Shinetsu), NFC (available from Japan Synthetic Rubber) or HM800X (available from Japan Synthetic Rubber). Not shown for clarity are a photoresist and an optional antireflective compound (ARC) which are used to define openings 62 for the cut areas. Specifically referring to FIG. 6B, the conductor 57 of gate layer 56 can be seen in the openings 62.

Referring now to FIGS. 7A and 7B, the openings 62 have been extended by etching gate layer 56 which requires etching of the gate conductor 57 (such as doped polysilicon) and the metal gate 55 if one is present. The gate conductor 57 is etched typically using a hydrogen bromide (HBr)-based chemistry in a plasma etch chamber while the metal gate 55 is etched using a halogen chemistry, again in a plasma etch chamber. Referring specifically to FIG. 7B, the high K layer 54 can be seen in the openings 62.

Figure 3:
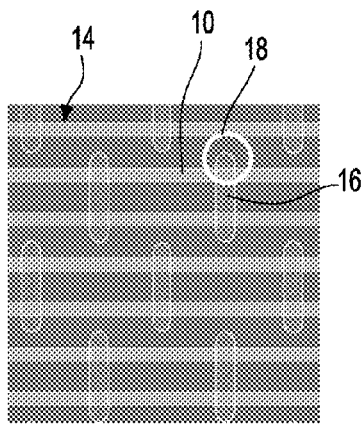
Figure 4:
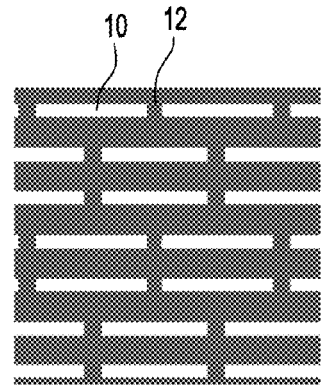
Figure 5A:
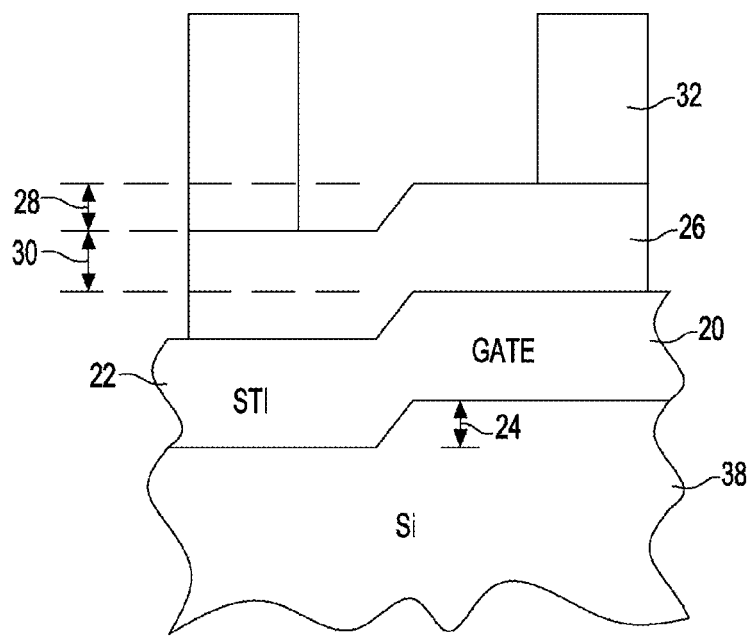
FIG. 5A illustrates the etching of a cut line with a present day hard mask.
Figure 5B:
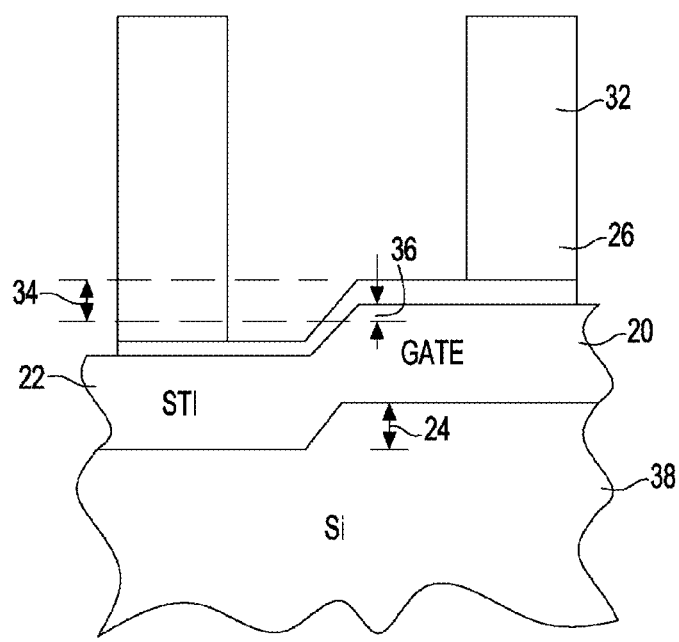
FIG. 5B illustrates the etching of a cut line with an advanced hard mask for smaller gates.

The OPL 60 is conventionally stripped to result in the structure shown in FIGS. 8A and 8B. Openings 62, upon subsequent etching steps, will form the cut areas 16 shown in FIGS. 3 and 4.

Figure 9A:
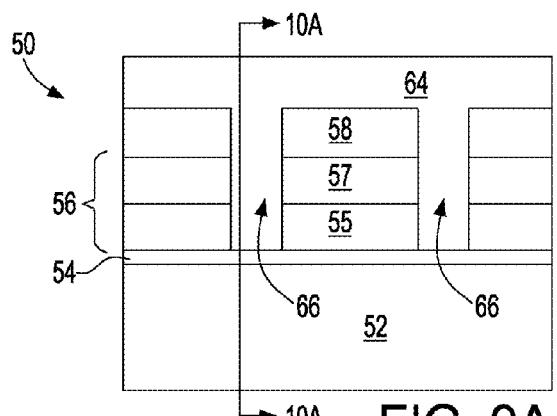
Figure 9B:
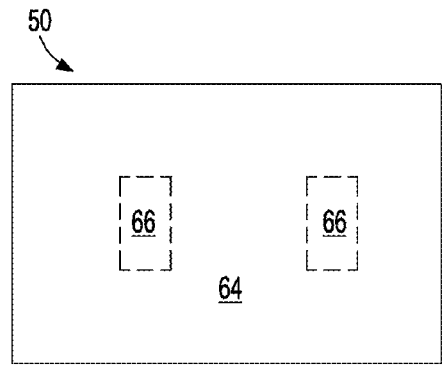

Referring now to FIGS. 9A and 9B, the process continues to form the gate lines. OPL 64 is applied over the semiconductor structure 50 which also fills the previously-formed openings 62, which are shown in phantom in FIG. 9B. The OPL-filled openings 62 are hereafter referred to with reference number 66.

Figure 10A:
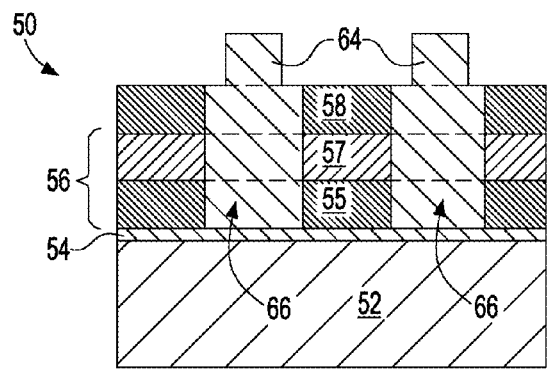
Figure 10B:
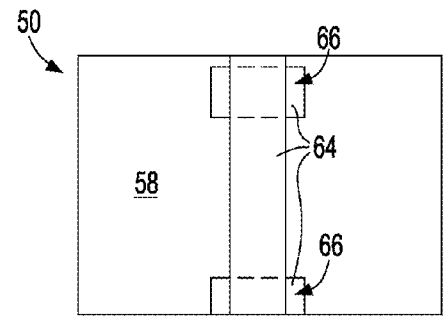

In order to more fully understand the formation of the gate lines, the semiconductor structure 50 shown in FIG. 9A is sectioned in the direction of line 10A-10A. Thus, in FIG. 10A, the viewer will be looking at the ends of the gate lines to be formed. Referring now to FIGS. 10A and 10B, the OPL 64 has been patterned so that there are lines of OPL 64 over the OPL-filled areas 66. The OPL is the bottom most layer of tri-layer lithography. The photoresist pattern is transferred into a SiARC and then the SIARC pattern is transferred into the OPL underneath. The OPL being an organic film, is etched in a plasma etch chamber using plasma containing O2, CO2, SO2, CO, N2O or other such oxidizing gases.

Figure 11A:
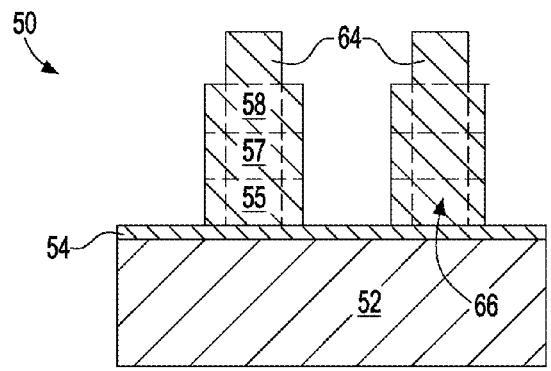
Figure 11B:
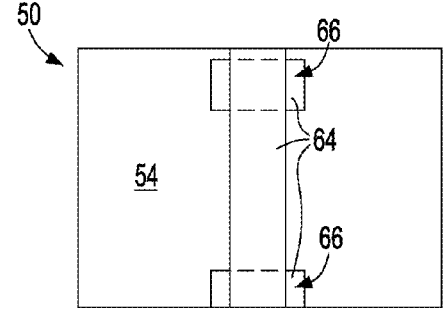

The semiconductor structure 50 is then etched again by a plasma based technique using typical anisotropic plasma etch techniques using the OPL as a mask to remove the exposed hard mask 58 and gate layer 56 as shown in FIGS. 11A and 11B. The etch selectivity of OPL with respect to the hard mask 58 and gate layer 56 is a novel aspect of the present invention. FIG. 11A is viewed in the same direction as FIG. 10A. Shown in phantom in FIG. 11A are the hard mask 58 and gate layer 56 underneath the lines of OPL 64. Combining FIGS. 11A and 11B show the lines of OPL 64 over the hard mask 58 and gate layer 56 as well as the OPL-filled areas 66. It can also be appreciated that the etched hard mask 58 and gate layer 56 form segmented lines which are separated by the OPL-filled areas 66.

Referring now to FIGS. 12A and 12B, the OPL 64 and OPL-filled areas 66 (in FIG. 11A) have been conventionally stripped to result in long islands of hard mask 58 and gate layer 56 over exposed high K layer 54. FIG. 12A is viewed in the same direction as FIGS. 10A and 11A.

Lastly, the high K layer 54 is etched typically in a hot chuck (200-400° C.) plasma etch reactor using an halogen chemistry using the hard mask 58 and gate layer 56 as a mask to result in long islands of hard mask 58 and gate layer 56 over high K layer 54 which, in this last step, form the gate lines 10 separated by the cut areas 16 as shown in FIGS. 13A and 13B. As can be seen, there is no overlap area with undesirable etching and no punch through into the first layer 52. FIG. 13A is viewed in the same direction as FIGS. 10A, 11A and 12A.

The hard mask 58 can be removed if desired for the particular semiconductor integration scheme utilized. However, the present inventors have found it to be advantageous to keep the hard mask 58 in place during subsequent processing of the semiconductor structure 50. Further, while the present inventors have found it advantageous to use a hard mask during the processing sequence described above, those skilled in the art will recognize that the present invention may be varied by foregoing the use of the hard mask.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. A multiple etch process for forming a gate in a semiconductor device, the method comprising the steps of:
   providing a semiconductor substrate;
   forming a conductor layer for forming transistor gates on the semiconductor substrate;
   applying a hard mask over the conductor layer;
   applying a first planarization player over the hard mask;
   patterning the hard mask and first planarization layer to form first openings over the conductor layer;
   etching the conductor layer through the first openings to extend the first openings into the conductor layer, the first openings being surrounded by the conductor layer, the hard mask and the first planarization layer;
   stripping the first planarization layer, leaving the first openings in the conductor layer, the first openings being surrounded by the conductor layer and the hard mask;
   applying a second planarization layer over the conductor layer and in the first openings in the conductor layer so as to completely fill the first openings;
   patterning the second planarization layer to form second openings over the conductor layer for spaces between gate lines, the second planarization layer extending completely over the filled first openings;
   etching the conductor layer through the second openings in the second planarization layer to form the spaces between gate lines resulting in lines of second planarization layer over lines of hard mask and conductor layer and between and completely over at least two adjacent filled first openings while avoiding etching the filled first openings wherein the lines of hard mask and conductor layer being separated by the second planarization layer in the filled first openings; and
   stripping the second planarization layer from the lines of hard mask and conductor layer and from the filled first openings to result in gate lines comprising hard mask and conductor layer separated by cut areas.

2. The method of claim 1 wherein the planarization layer is an organic planarizing layer.

3. The method of claim 2 wherein the patterning of the first planarization layer and second planarization layer is selective to the etching of the hard mask and conductor layer.

4. The method of claim 1 wherein the conductor layer includes a polysilicon layer and a metal gate layer.

5. The method of claim 1 wherein the conductor layer includes a polysilicon layer, a metal gate layer and a high dielectric constant dielectric layer.

6. The method of claim 1 wherein the first planarization layer and second planarization layer include an antireflective compound layer.

7. The method of claim 1 further comprising the step after stripping the second planarization layer of stripping the hard mask.

8. A multiple etch process for forming a gate in a semiconductor device, the method comprising the steps of:
   providing a semiconductor substrate;
   forming a conductor layer for forming transistor gates on the semiconductor substrate;
   applying a first planarization player over the conductor layer;
   patterning the first planarization layer to form first openings over the conductor layer;
   etching the conductor layer through the first openings to extend the first openings into the conductor layer, the first openings being surrounded by the conductor layer and the first planarization layer;
   stripping the first planarization layer, leaving the first openings in the conductor layer, the first openings being surrounded by the conductor layer;
   applying a second planarization layer over the conductor layer and in the first openings in the conductor layer so as to completely fill the first openings;
   patterning the second planarization layer to form second openings over the conductor layer for spaces between gate lines, the second planarization layer extending completely over the filled first openings;
   etching the conductor layer through the second openings in the second planarization layer to form the spaces between gate lines resulting in lines of second planarization layer over lines of conductor layer and between and completely over at least two adjacent filled first openings while avoiding etching the filled first openings wherein the lines of conductor layer being separated by the second planarization layer in the filled first openings; and
   stripping the second planarization layer from the lines of conductor layer and from the filled first openings to result in gate lines comprising conductor layer separated by cut areas.

9. The method of claim 8 wherein the first and second planarization layers are an organic planarization layer.

10. The method of claim 9 wherein the patterning of the first planarization layer and second planarization layer is selective to the etching of the conductor layer.

11. The method of claim 8 wherein the conductor layer includes a polysilicon layer and a metal gate layer.

12. The method of claim 8 wherein the conductor layer includes a polysilicon layer, a metal gate layer and a high dielectric constant dielectric layer.

13. The method of claim 8 wherein the first planarization layer and second planarization layer include an antireflective compound layer.

* * * * *